United States Patent
Drewery et al.

(10) Patent No.: US 6,790,773 B1
(45) Date of Patent: Sep. 14, 2004

(54) PROCESS FOR FORMING BARRIER/SEED STRUCTURES FOR INTEGRATED CIRCUITS

(75) Inventors: John S. Drewery, Alameda, CA (US); Ronald A. Powell, San Carlos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/232,445

(22) Filed: Aug. 28, 2002

(51) Int. Cl.[7] .................. H01L 21/44; H01L 21/4763
(52) U.S. Cl. ................ 438/643; 438/644; 438/653; 438/654; 438/678; 438/687; 438/688
(58) Field of Search .................. 438/68, 678, 672–675, 438/656, 627–629, 633, 637–641, 642–644, 648, 650, 686–688

(56) References Cited

U.S. PATENT DOCUMENTS

| | | | | |
|---|---|---|---|---|
| 6,136,707 A | * | 10/2000 | Cohen | 438/687 |
| 6,156,651 A | * | 12/2000 | Havemann | 438/674 |
| 6,511,910 B2 | * | 1/2003 | Asahina et al. | 438/643 |
| 6,518,668 B2 | * | 2/2003 | Cohen | 257/751 |
| 6,528,412 B1 | * | 3/2003 | Wang et al. | 438/628 |

* cited by examiner

Primary Examiner—Thanh Nguyen
(74) Attorney, Agent, or Firm—MacPherson Kwok Chen & Heid LLP; Tom Chen

(57) ABSTRACT

A process and structure are provided that allows electroplating to fill sub-micron, high aspect ratio features using a non-conformal conductive layer between the dielectric layer and the platability layer. The conductive layer is a relatively thick layer overlying the planar surface of the wafer and the bottom of the features to be filled. Little or no material of the conductive layer is formed on the feature sidewalls. The thick conductive layer on the field provides adequate conductivity for uniform electroplating, while the absence of significant conductive material on the sidewalls decreases the aspect ratio of the feature and makes void-free filling easier to accomplish with electroplating. Further, the absence of significant material on the sidewalls allows a thicker barrier layer to be formed for higher reliability.

18 Claims, 4 Drawing Sheets

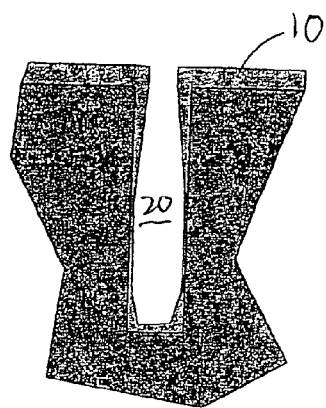
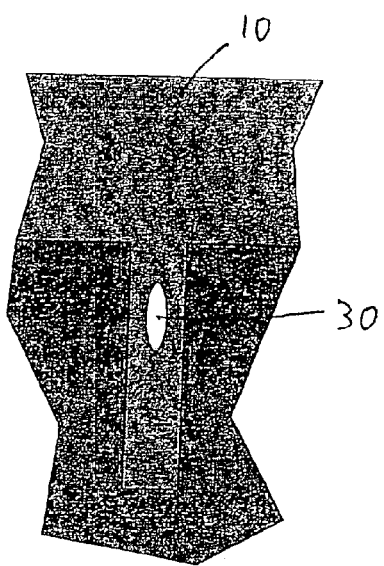
Fig. 1A
Prior Art
Fig. 1B
Prior Art

PROCESS FOR FORMING BARRIER/SEED STRUCTURES FOR INTEGRATED CIRCUITS

BACKGROUND OF THE INVENTION

1. Field of the Invention

The present invention relates to semiconductor devices and processing, and in particular, to electroplating and fabrication of layers prior to electroplating.

2. Discussion of the Related Art

Integrated circuits fabricated on semiconductor substrates for very and ultra large scale integration typically require multiple levels of metal layers to electrically interconnect the discrete layers of semiconductor devices on the semiconductor chips. The different levels of metal layers are separated by various insulating or dielectric layers (also known as interlevel dielectric (ILD) layers), which have etched via holes to connect devices or active regions from one layer of metal to the next.

As semiconductor technology advances, circuit elements and dimensions on wafers or silicon substrates are becoming increasingly more dense. Consequently, the interconnections between various circuit elements and dielectric layers need to be as small as possible. One way to reduce the size of interconnection lines and vias is to use copper (Cu) as the interconnect material instead of conventionally used materials such as aluminum (Al). Because copper has lower resistivities and significantly higher electromigration resistance as compared to aluminum, copper advantageously enables higher current densities experienced at high levels of integration and increased device speed at higher frequencies. Thus, major integrated circuit manufacturers are transitioning from aluminum-based metallization technology to dual damascene copper technology.

However, the use of copper as the interconnect material presents various problems. For example, copper atoms can readily diffuse into adjacent ILD or other dielectric layers, which can compromise their integrity as insulators or cause voids in the conductors because of out-diffusion of the copper. As a result, a diffusion barrier layer is typically formed between the dielectric layer and the copper layer. Materials for the barrier layer include Tantalum (Ta), Tungsten Nitride (WN), Titanium Nitride (TiN), Tantalum Nitride (TaN), Silicon Nitride (SiN), and Tungsten (W). The barrier layer may be deposited using a conventional chemical vapor deposition (CVD) process, physical vapor deposition (PVD) process or other known deposition process.

Dual damascene techniques rely on electroplating to fill small features (of order 100 nm in width) with copper. In order for this to work, a "seed layer" must be applied to the wafer to provide enough electrical conductance across the wafer, so that a sufficiently uniform layer can be electroplated. In order to electroplate copper, the underlying surface has to be able to conduct current across its surface since electroplating is an electrochemical process. The diffusion barrier typically has high sheet resistance, so that the current required for plating causes an excessive voltage drop between the center and edge of the wafer. Thus, a seed layer, typically copper, is deposited over the diffusion barrier. Deposition can be performed by any suitable process, such as PVD.

However, there are difficulties in forming the seed layer, due in part to contradictory requirements for the seed layer. First, it must be conductive enough across the face of the wafer that a uniform electroplating process can be carried out. A seed layer that is too thin does not achieve bulk conductivity, and electron scattering effects also decrease the effective conductivity of such thin films. Further, thin copper seed layers generally do not coat the barrier layer in a uniform manner, resulting in the inability to properly apply a subsequent electrochemically deposited copper layer. When a discontinuity is present in the seed layer, the portion of the seed layer that is not electrically connected to the bias power supply does not receive deposition during the electroplating process. This is particularly prevalent with high aspect ratio, sub-micron features, where the bottom surface and lower sidewalls of these features are especially difficult to coat using PVD. Thus, in general, thicker seed layers are desirable for uniform electroplating.

Current minimum thicknesses for copper seed layers are 30 nm with processes in the field that require less than 1 ohm per square sheet seed resistance. With improvements in electroplating technology, films as resistive as 5 ohms per square may eventually be suitable seeds, thereby reducing the minimum seed thickness to 9 nm of copper.

However, a second requirement limits the thickness of the combined barrier and seed layer on the sidewalls of the feature or vias to be filled. The limit arises because there is a maximum aspect ratio of a feature that can be successfully filled by electroplating. Presently, PVD has been used to deposit the seed layers. As shown in FIG. 1A, PVD forms a seed layer 10 having a much thicker layer on the planar surface ("field") of the wafer than within the small features such as vias 20 and trenches, i.e., the deposition is non-conformal. The thicker material in the field allows current to be conducted across the wafer, while there is sufficient copper in the features to allow electroplating in the features. With lower aspect ratio features, e.g., <3:1, the opening of feature stays open long enough to allow a void-free fill with the electroplating.

But successive reduction in feature sizes has meant that there is increasing difficulty in this process. When the seed layer is formed on the sidewalls as well as the bottom of the feature, the electroplating process deposits the metal on both surfaces within the feature. FIG. 1A shows the opening of the feature being "closed off" with seed layer deposition by PVD. With higher aspect ratio features, the electroplated metal growth on the wall tends to close off the feature at the aperture opening before the feature has been completely filled, resulting in a void 30 forming within the feature, as shown in FIG. 1B. The void changes the material and operating characteristics of the interconnect feature and may cause improper operation and premature breakdown of the device. Even directional PVD such as that carried out using a Hollow Cathode Magnetron (HCM) source gives films with a slight overhang. Thus, with current processes, relatively thin copper seed layers are necessary to fill high aspect ratio features void-free.

However, also with current technology, there is a limit of about 15 nm on the total thickness of material deposited on a via sidewall before electroplating, although this thickness is expected to decrease, down to about 12 nm for test structures at the 45 nm technology node. This thickness includes the barrier layer and any other layers needed before electroplating. Assuming that these other layers take up about 3 nm, about 8 nm of copper are available for the seed. For a layer that is about 100% conformal, such as those deposited electrolessly, by thermal CVD, or by atomic layer deposition (ALD), the field conductivity requirement necessitates an effective resistivity of less than 4 microohm-cm for the seed layer.

Effective resistivities at the thickness under consideration are considerably greater than bulk resistivities because of electron scattering at the metal surfaces. Also, the topology of the wafer surface serves to further increase the voltage drop from the center to the edge of the wafer. As a result, only copper and silver satisfy all requirements, of which copper would be more generally accepted. Another requirement is that the seed layer must enable electroplating with good adhesion. However, it is not yet known how such a conformal copper layer can be deposited with good adhesion over presently accepted barrier layers.

Clearly if the barrier and seed are one and the same then the thickness allocated for the barrier and seed is all available for this layer. For a given sheet resistance, then, a more resistive seed material may be used. So, a directly platable barrier with approximately 10 microohm-cm resistivity can be contemplated.

The expected obsolescence of the PVD process is unfortunate, as PVD films tend to exhibit good adhesion. Also, PVD films are non-conformal, i.e., thicker in the field than within the features. For example, a seed layer 20 nm wide in the field might have a thickness of 10 nm or less inside the feature. This results in a lower aspect ratio of the feature after the seed layer deposition and easier void-free fill with electroplating. Unfortunately, however, this 20 nm PVD film would deposit well under 10 nm in high aspect ratio features. In such a case, the seed layer would not be continuous, and reliability issues arising from poor adhesion of the electroplated film would arise. These considerations limit the extendibility of PVD films.

On the other hand, conformal films such as those deposited by CVD and ALD will be difficult to deposit with the proper conductance characteristics. For example, a film 20 nm thick in the field would also be about 20 nm thick in the features. So for a via 70 nm across, only a hole 30 nm across would remain, which results in an aspect ratio that is very difficult to completely fill by electroplating.

Accordingly, it is desirable to be able to perform electroplating for void-free fill of high aspect ratio features without the problems and limitations of conventional techniques discussed above.

SUMMARY OF THE INVENTION

In accordance with the present invention, a non-conformal conductive layer is deposited over a semiconductor wafer prior to formation of a platability layer and electroplating. The conductive layer is a relatively thick layer overlying the planar surface of the wafer and the bottom of the features to be filled, such as vias. Little or no material from the conductive layer deposition is formed on the feature sidewalls. The thick conductive layer on the field provides adequate conductivity for uniform electroplating, while the absence of significant conductive material on the sidewalls decreases the aspect ratio of the feature and makes void-free filling easier to accomplish with electroplating. Further, the absence of significant material on the sidewalls allows a thicker barrier layer to be formed for higher reliability.

In one embodiment, a dielectric layer is etched with a feature to be filled, such as a via, damascene, or dual damascene structure. A conformal barrier layer is deposited over the dielectric layer and feature. Suitable materials include Ta, $TaN_x$, $TiN_x$, $TiN_xSi_y$, W, Ru, $WN_x$, $RuO_2$, Mo, and $MoN_x$ with ranges of thicknesses between 2 nm and 10 nm. A non-conformal conductive layer is then formed, such as copper PVD, to a thickness of 8 nm to 25 nm. Little or no material is deposited on the sidewalls of the feature. Other suitable materials include W and Co, deposited by PVD. Because this conductive layer essentially only deposits on the planar surface of the wafer (i.e., the field) and the bottom surface of the feature, the aspect ratio of the feature is less than the aspect ratio of a feature to which a conformal conductive layer of the same thickness in the field has been applied. Next, a conformal platability layer is deposited for subsequent electroplating. The platability layer can be made from materials including Co, Cu, W, Ru, and Mo, deposited by electroless deposition, CVD, ALD, and/or PNL™, a deposition technique involving alternating pulses of gaseous precursors. An electroplating process, such as with copper, then fills the feature from the bottom up.

In another embodiment, a dielectric layer is etched with a feature to be filled. A non-conformal conductive layer is then formed directly over the dielectric layer and feature, where the conductive layer is such that no barrier layer is needed between it and the underlying dielectric layer. Suitable materials include W and Co, with thicknesses ranging from 10 nm to 25 nm. Again, as with the previous embodiment, little or no material is formed on the feature sidewalls. Next, a barrier/platability layer is deposited over the conductive layer and feature. The barrier/platability layer has properties of good adhesion to the conductive and dielectric layers and good barrier to copper diffusion from the subsequently electrofilled copper. The layer can be a single layer or a multi-layer stack. Suitable materials and processes include W by PNL™ or CVD, $WN_x$ by PNL™ followed by W by $WN_x$, Co by ALD followed by W or $WN_x$ by PNL™, TiN by ALD followed by W by PNL™, and Ru by ALD or CVD. An electroplating process then fills the feature with a copper bottom-up fill.

With either embodiment, if the layer preceding the electroplating does not support a bottom-up fill, a thin seed layer, such as a copper seed, is deposited before electroplating. The thickness of the seed layer ranges from 4 nm to 10 nm.

This invention will be more fully understood in light of the following detailed description taken together with the accompanying drawings.

BRIEF DESCRIPTION OF THE DRAWINGS

FIG. 1A is a cross-sectional view of a portion of a semiconductor device with a feature, in which a seed layer has been deposited by PVD with a prior art process;

FIG. 1B is a cross-sectional view of the device of FIG. 1A, in which the feature has been filled by copper electroplating;

Use of the same reference numbers in different figures indicates similar or like elements.

DETAILED DESCRIPTION

The present invention provides a process and structure that allows electroplating to fill sub-micron, high aspect ratio features using a conductive layer between the dielectric layer and the platability layer. The conductive layer is formed mainly on the field, i.e., the planar surface of the wafer, with little or no material along the sidewalls of the features to be filled. This allows thicker and more reliable barrier layers, while still maintaining void-free fill capability.

In one embodiment, a conformal barrier layer is first deposited over the dielectric layer and features. A conductive layer is then deposited, such as by PVD, over the wafer, where the conductive layer forms mainly over the planar surface of the wafer, with little or no deposition on the sidewalls. Next, a conformal platability layer is deposited over the wafer, and electroplating is performed to fill the features. FIGS. 2A–2E show cross-sectional views of a portion of a semiconductor wafer during various stages of a process flow according to one embodiment of the invention.

Figure 2A:
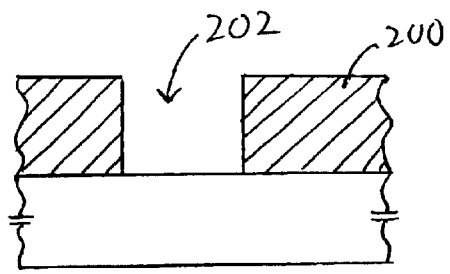
FIGS. 2A–2E are cross-sectional views of a semiconductor device at various stages of processing, according to one embodiment of the invention.

First, a dielectric or insulating layer 200, such as a silicon oxide, is conventionally formed over a semiconductor wafer, as shown in FIG. 2A. Insulating layer 200 can be deposited over the silicon substrate, in which transistors or other active areas have been formed, over patterned metal layers, or over any other suitable layer that requires electrical connection to areas on the same or adjacent layers. Dielectric layer 200 is then etched to form features, such as vias 202, over selected areas for electrical connection. In one embodiment, features with aspect ratios up to about 10:1 can be filled with the present invention. Note that other features can also be etched from the dielectric, such as contacts, lines, damascene and dual damascene structures having a via and a trench portion. Etching can be performed with conventional methods, such as photolithography techniques in which deposited photoresist is patterned and used as a mask to etch dielectric layer.

Figure 2B:
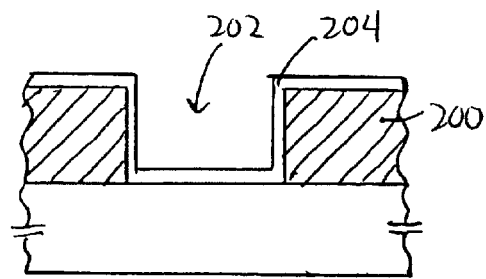

In FIG. 2B, a conformal barrier layer 204 has been deposited over the semiconductor wafer. Barrier layer 204 forms a relatively uniform layer of material over the planar surface of the wafer, the sidewalls of via 202, and the bottom of via 202. Suitable materials include Tantalum (Ta), $TaN_x$, Titanium Nitride ($TiN_x$), $TiN_xSi_y$, Tungsten (W), Tungsten Nitride ($WN_x$), Ruthenium (Ru), $RuO_2$, Molybdenum (Mo), and $Mo_xN_y$, where x and y are non-zero numbers. This list is not exhaustive, and other materials are ones that can be deposited with good adhesion and that when deposited as an layer approximately 2–10 nm thick shows acceptable barrier performance. These films can be deposited either by CVD or PDL™ techniques. PDL™ processes involve using sequential pulses of different precursors to form a thin conformal film. In one embodiment, a suitable CVD TiN(Si) film may be formed by exposing the wafer, heated to about 250° C., to a vapor of tetrakis (diethylamido) titanium (TDEAT) at about 20 Torr, then performing a "soak" in silane gas following deposition. The deposited film is typically 4 nm thick. Barrier layer 204 prevents atoms from the subsequently deposited metal layer from migrating into the dielectric layers, since this can cause the integrity of the dielectric layer to be compromised or cause voids in the conductors because of out-diffusion of the copper.

Figure 2C:
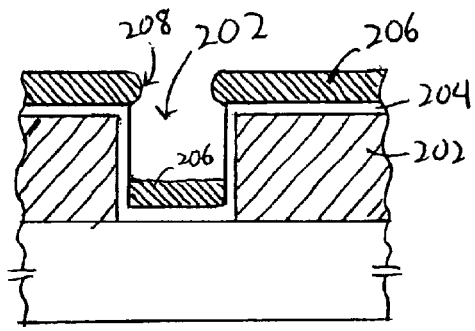

In FIG. 2C, a non-conformal conductive layer, such as copper layer 206, is deposited over the wafer. In one embodiment, deposition is performed by an ionized physical vapor deposition (PVD) tool using hollow cathode magnetron (HCM) sputter source technology. Other non-conformal PVD techniques are also suitable, such as that described in U.S. Pat. No. 6,080,287 to Drewery and Licata and U.S. Pat. No. 6,277,249 to Gopalraja et al., both of which are incorporated by reference in their entirety. Generally these techniques create positive ions of copper that are attracted towards the wafer by the electric field within a plasma sheath formed over the wafer. As a result the ions move in a direction normal to the wafer, and excessive overhang of the copper is avoided. One technique deposits Cu from a 300 mm hollow cathode magnetron using 60 kW of DC power and a sputtering gas pressure between 0 and 20 mTorr, preferably 5 mTorr. The wafer is held at or below 25° C. during this process to avoid excessive surface diffusion of the Cu. The thickness of copper layer 206 is between approximately 8 nm and 25 nm. In one embodiment, copper layer 206 is approximately 15 nm thick. In other embodiments, the non-conformal layer material is W or Co. These other materials may be desirable because they exhibit better adhesion with the material of barrier layer 204 and/or the subsequently deposited conformal platability layer.

Because copper layer 206 is non-conformal, the layer deposits mainly on the planar surface of the wafer and the bottom of via 202, with little or no material on the via sidewalls. Although none of copper layer 206 is shown on the sidewalls of FIG. 2C, small amounts of material, which can promote nucleation and adhesion to the barrier, can be tolerated. In one embodiment, the sidewall coverage is less than 10% of the field coverage.

One important characteristic of copper layer 206 is that it be a relatively thick layer, while still minimizing the overhang 208 at the opening of via 202. The larger the opening to via 202 before filling, the more likely via 202 can be completely filled with no voids. Further, since little or no copper is formed on the via sidewalls, a thicker conductive layer can be deposited. A thick conductive or copper layer 206 across the wafer surface will provide adequate within-field conductivity and more reliability to allow electroplating with acceptable uniformity. In addition, because the copper deposition is non-conformal, the resulting aspect ratio (AR) of the feature will not be greatly increased compared to the original AR, i.e., the height of the feature will be less by the difference between the field coverage and the coverage at the feature bottom, but the width will remain approximately the same. In comparison, if a conformal seed layer the same thickness in the field as layer 206 was used, the aspect ratio would be considerably increased.

Figure 2D:
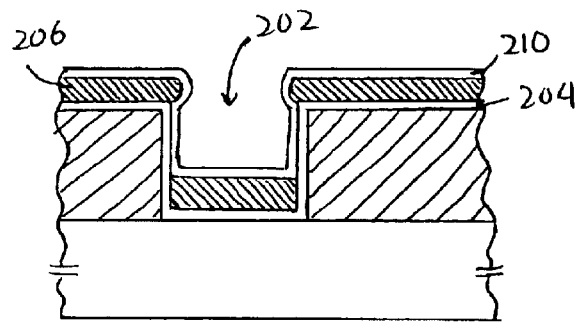

Next, in FIG. 2D, a conformal platability layer 210 is deposited over the wafer. In one embodiment, platability layer 210 has a thickness between 2 nm and 20 nm, with a typical thickness of 8 nm. Because there may be little or no conductive layer material on the sidewalls of via 202, platability layer 210 must have good adhesion to barrier layer 204 as well as to the conductive or copper layer 206. Further, the materials for platability layer 210 must be capable of being electroplated with a bottom-up fill and good adhesion. A further embodiment in keeping with the invention is possible if platability layer 210 does not allow a bottom-up fill. In this case, a thin seed layer is deposited before bottom-up electroplating, as will be discussed in more detail below. Factors causing this include a presence of an oxide film on the surface, due either to atmospheric oxidation or oxidation in the plating chemistry and the barrier being excessively soluble in the plating chemistry.

Examples of suitable materials and corresponding deposition processes and thicknesses are listed in Table 1 below.

TABLE 1

| Material | Deposition method | Thickness |
| --- | --- | --- |
| Cu | electroless | 5–20 nm |

TABLE 1-continued

| Material | Deposition method | Thickness |
|---|---|---|
| Cu | ALD | 2–20 nm |
| Cu | CVD | 5–20 nm |
| Cu | ALD/CVD | 2–20 nm |
| Co | electroless | 3–10 nm |
| Co | CVD | 3–10 nm |
| Co | ALD | 2–10 nm |
| W | PNL ™ | 2–6 nm |
| Ru | CVD | 3–15 nm |
| Mo | CVD | 3–15 nm |

PNL™ is a process whereby alternating exposures to silane ($SiH_4$) and tungsten hexafluoride ($WF_6$) are used to produce a thin continuous film of tungsten.

Figure 2E:
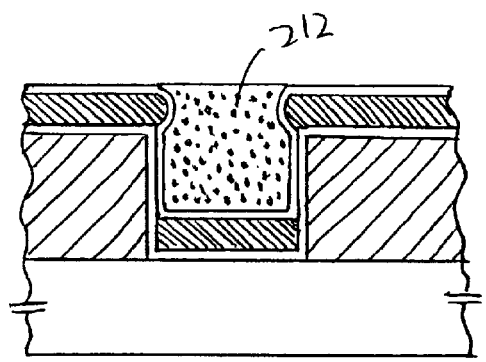

A conventional electroplating process, in which features are filled from the bottom up, then fills the features with copper 212 or other suitable material without any voids, as shown in FIG. 2E. Planarization, such as by CMP, removes the excess copper, and further processing continues.

In accordance with another embodiment of the invention, a non-conformal conductive layer is first deposited, such as ionized PVD, over the dielectric layer and features. As with the conductive layer with the previous embodiment, the conductive layer forms mainly over the planar surface of the wafer, with little or no deposition on the sidewalls. A conformal barrier/platability layer is then deposited over the wafer, and electroplating is performed to fill the features, either with or without a prior seed layer.

Figure 3A:
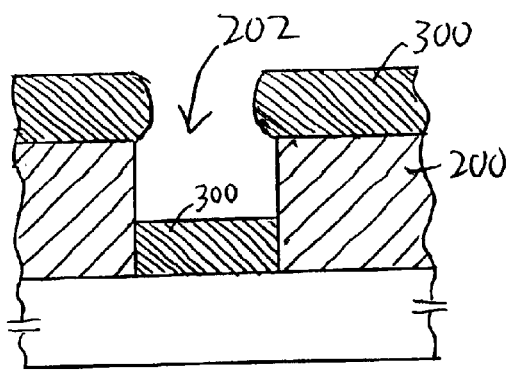
FIGS. 3A–3C are cross-sectional views of a semiconductor device at various stages of processing according to another embodiment of the invention.
Figure 3B:
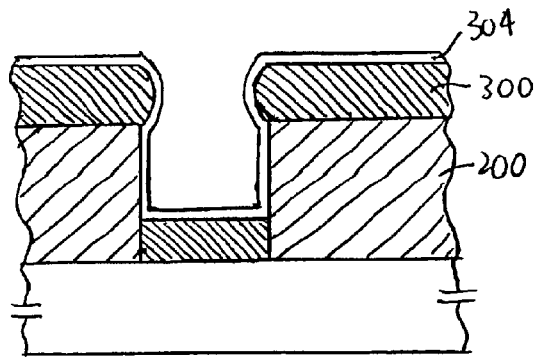
Figure 3C:
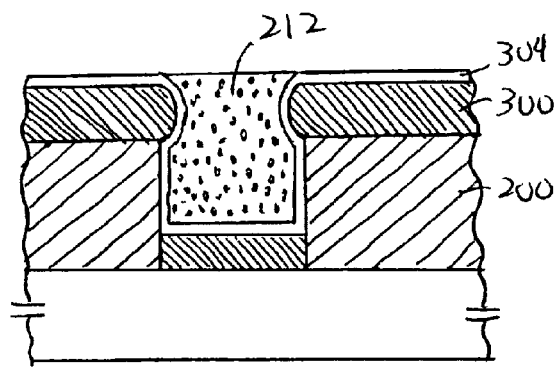

FIGS. 3A–3C show cross-sectional views of a portion of a semiconductor wafer during various stages of a process flow according to another embodiment of the invention.

Starting with the structure of FIG. 2A, a non-conformal conductive layer 300 is deposited over the wafer, as shown in FIG. 3A. Materials for conductive layer 300 include W, Co, Ru, Mo, Pt, Pd or any other materials having a resistivity below 15 $\mu\Omega$cm and having good adhesion to the underlying dielectric layer. One difference between this embodiment and the embodiment of FIGS. 2A–2E is that no barrier layer is formed between the dielectric layer and the conductive layer. Consequently, conductive layer 300 must also have the property that the metal atoms do not migrate into the dielectric layer or that the particular atoms migrating into the dielectric are acceptable. In some cases, dielectric materials may be selected or surface processed such that a barrier layer is not. In one embodiment, conductive layer is a 10 to 50 nm layer of tungsten, typically 40 nm, deposited by ionized PVD. For thicknesses less than 20 nm, a conventional planar magnetron PVD source may be used. Alternatively, electron beam evaporation may be used to produce the required directional metal flux.

As with the conductive layer of FIGS. 2A–2E, conductive layer 300 is formed on the planar surface of the wafer and on the bottom surface of via 202. Little or no material is deposited on the sidewalls of via 202, but some material is acceptable for nucleation. Also, as with the previous embodiment, the aspect ratio will change after deposition of the conductive layer.

After non-conformal conductive layer 300 is deposited, a conformal barrier/platability layer 304 is deposited over the wafer, as shown in FIG. 3B. As used herein, "barrier/platability layer" can be a single film or layer or a series of layers, where the series of layers can be formed continuously in the same tool or as separate barrier and platability layers.

Table 2 below lists various types of barrier/platability layer 304, with corresponding material, deposition type, and range of thicknesses. Note that in the table, for multiple layers, the deposition of the second material follows that of the first material.

TABLE 2

| Layer | Material | Deposition method | Thickness |
|---|---|---|---|
| Single | W | PNL ™ | 2–15 nm |
| Single | W | CVD | 5–15 nm |
| Multiple | $WN_x$ | PNL ™ | 1–10 nm |
|  | W | PNL ™ | 1–10 nm |
|  |  |  | total to be ≦15 nm |
| Multiple | Co | ALD | 1–10 nm |
|  | W or $WN_x$ | PNL ™ | 2–10 nm |
|  |  |  | total to be ≦15 nm |
| Multiple | TiN | ALD | 1–10 nm |
|  | W | PNL ™ | 2–10 nm |
|  |  |  | total to be ≦15 nm |
| Single | Ru | ALD or CVD | 2–15 nm |

Regardless of the type of material, layer 304 must have good adhesion to conductive layer 300 and dielectric layer 200. Further, if a seed layer is required to be deposited over conductive layer 300, as will be described below, barrier/platability layer 304 must also have good adhesion to this seed layer. Also, since there is no separate barrier layer as with the earlier embodiment, layer 304 must act as a barrier between dielectric layer 200 and the subsequently electrodeposited Cu. The different types of layer 304 listed in Table 2 satisfy these conditions, but are not meant to be exhaustive.

If barrier/platability layer 304 is not platable with a bottom-up fill, a conformal seed layer is deposited, for example, by electroless plating or by ALD or CVD. The seed layer can be a copper, metallic, or copper-alloy seed. The preferred thickness for the seed is the minimum needed to ensure a continuous conformal coverage, e.g., 2 to 6 nm. The combined thickness of barrier layer 204 and platability layer 210 or barrier/platability layer 304 with this seed layer should be no more than 15 nm consistent with the need to avoid an excessive increase in the aspect ratio of the feature. It is clear that embodiments in which this additional layer are unnecessary are preferred over those in which it is needed, as the cost of making the structure is thereby lowered. Although Cu is the preferred material, candidates such as Pt, Pd, and Ru may also be plated, and they have the advantage of not being attacked by conventional plating chemistries, and therefore may be deposited as a thinner layer.

Conventional copper electroplating with bottom-up fill is then carried out to fill the features, and a subsequent CMP step is performed to remove the excess copper, as shown in FIG. 3C. Planarization, such as by CMP, removes the excess copper, and further processing continues.

One of the major advantages of the present invention is that a thicker conformal barrier layer can be deposited, which increases the reliability. Since a thick seed layer on the sidewall of features to be filled is not needed, the barrier thickness on the sidewalls can be increased compared to previous methods. The non-conformal deposition also has little impact on the eventual aspect ratio of the feature, making it easier to perform a void-free fill using a bottom-up electroplating fill process. Table 3 shows an example comparing conventional processes using a conformal seed layer to the process of the present invention.

TABLE 3

| Process | Barrier layer | Seed layer | Glue layer | Aspect Ratio |
| --- | --- | --- | --- | --- |
| Conformal seed | 2 | 8 | 0 | 10 |
| Invention | 4 | 0 | 4 | 9.25 |

The glue layer of Table 3 refers to platability layer 210 (FIG. 2D) and barrier/platability layer 304 (FIG. 3B). No glue layer is needed for a conformal seed process, as shown in FIG. 4B. As seen from Table 4, the barrier layer of the present invention can be made thicker, and the aspect ratio of the feature to be filled has been lowered.

The process is extendable for the foreseeable future. Present barrier technology using CVD demonstrates that a 4 nm layer can be expected to be a good barrier. However, it is believed that a Metallo-Organic Chemical Vapor Deposition (MOCVD) process should be able to make a platability layer with similar thickness. This development would eliminate the need for ALD, which is driven by the desire for thinner and thinner barriers so that the seed can be accommodated. One way to carry such a process is with a tool similar to the Novellus Inova xT™ fitted with HCM copper and MOCVD barrier and platability modules from Novellus Systems, Inc., San Jose, Calif.

Figure 4A:
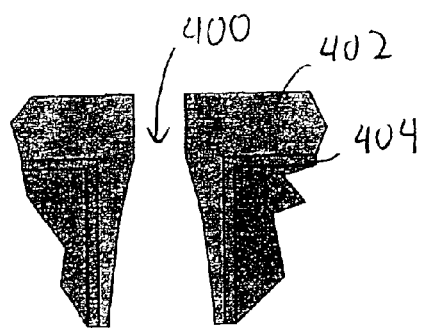
FIGS. 4A–4C are cross-sectional views of portions of semiconductor devices before electroplating according to conventional methods and to an embodiment of the present invention.
Figure 4B:
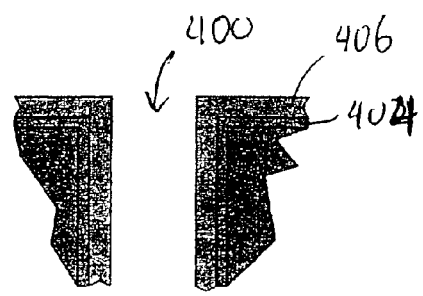
Figure 4C:
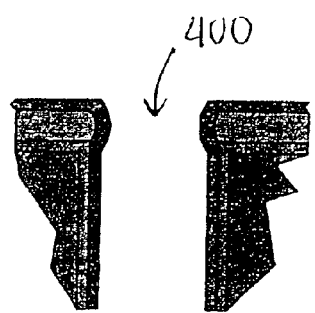

A further example illustrating the differences between the present invention and conventional techniques is shown in FIGS. 4A–4C. FIG. 4A shows a portion of a via 400, in which a 30 nm non-conformal PVD seed layer 402 has been deposited over a barrier layer 404. In this example, the width of via 400 before deposition of barrier layer 404 and seed layer 402 is approximately 45 nm. FIG. 4B shows the same via 400 and barrier layer 404, but with a conformal 10 nm seed layer 406. FIG. 4C shows the same via 400, but with the process described above in FIGS. 2A–2E. Even though the mouth of via 400 is slightly constricted in FIG. 4C, the opening is still wider than with the structures of FIGS. 4A and 4B. Further, the aspect ratio of the is lower than with the structure of FIG. 4B, and the field conductivity is more than 33% higher. The same advantages apply with the embodiment of FIGS. 3A–3C.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A method of processing a semiconductor wafer, comprising:

providing a dielectric layer;

etching a feature within the dielectric layer, wherein the feature comprises a sidewall and a bottom surface;

depositing a non-conformal conductive layer over the dielectric layer and the bottom surface of the feature, wherein the conductive layer on the sidewall is less then 10% of the thickness of the conductive layer over the dielectric layer;

depositing a single conformal barrier and platability layer over the non-conformal conductive layer, and electroplating a conductive material to fill the feature.

2. The method of claim 1, wherein the conductive material is copper.

3. The method of claim 1, wherein the feature comprises a via.

4. The method of claim 1, wherein depositing the conformal layer is by CVD.

5. The method of claim 1, wherein the conductive layer is selected from the group consisting of Cu, W, Co, Ru, Mo, Pt, and Pd.

6. The method of claim 1, wherein the conductive layer is between 8 nm and 25 nm over the planar surface of the dielectric layer.

7. The method of claim 1, wherein the single conformal barrier and platability layer comprises tungsten or Ru.

8. The method of claim 1, wherein the electroplating is a bottom-up fill.

9. The method of claim 1, wherein the conductive layer has a resistivity below approximately 15 $\mu\Omega$cm.

10. The method of claim 9, wherein the conductive layer is cobalt or tungsten.

11. The method of claim 10, wherein the conductive layer has a thickness between approximately 10 nm and 25 nm.

12. The method of claim 1, further comprising depositing a seed layer over the single conformal barrier and platability layer prior to the electroplating.

13. The method of claim 1, wherein the barrier and platability layer is a tungsten layer.

14. The method of claim 13, wherein tungsten layer is approximately 2 to 15 nm thick and deposited by PNL.

15. The method of claim 13 wherein the tungsten layer is approximately 5 to 15 nm thick and deposited by CVD.

16. The method of claim 1, wherein the barrier and platability layer is a Ru layer deposited by ALD or CVD.

17. The method of claim 16, wherein the Ru layer is approximately 2 to 15 nm thick.

18. The method of claim 1, wherein the barrier and platability layer is in physical contact with the sidewall of the feature.

\* \* \* \* \*